United States Patent [19]
Sachs

[11] Patent Number: 6,036,777
[45] Date of Patent: Mar. 14, 2000

[54] POWDER DISPENSING APPARATUS USING VIBRATION

[75] Inventor: Emanuel M. Sachs, Newton, Mass.

[73] Assignee: Massachusetts Institute of Technology, Cambridge, Mass.

[21] Appl. No.: 08/422,384

[22] Filed: Apr. 14, 1995

Related U.S. Application Data

[63] Continuation of application No. 08/019,470, Feb. 18, 1993, abandoned, which is a continuation of application No. 07/447,677, Dec. 8, 1989, Pat. No. 5,204,055.

[51] Int. Cl.[7] .............................. B05C 11/02; B05C 19/00
[52] U.S. Cl. .............................. 118/56; 118/57; 118/120; 118/308; 118/310; 118/612
[58] Field of Search ................................. 118/56, 57, 100, 118/120, 300, 308, 310, 429, 422, 612, 22, 421

[56] References Cited

U.S. PATENT DOCUMENTS

| | | | |
|---|---|---|---|
| 2,671,741 | 3/1954 | Duvall | 134/2 |
| 2,903,376 | 9/1959 | Donahue . | |
| 2,985,939 | 5/1961 | Brockman | 25/157 |
| 3,302,655 | 2/1967 | Sasaki et al. | 134/79 |
| 3,451,401 | 6/1969 | Levinson | 134/58 |
| 3,747,560 | 7/1973 | Roberts et al. . | |
| 3,868,267 | 2/1975 | Gazza et al. | 117/22 |
| 3,887,392 | 6/1975 | Tang | 134/1 |
| 3,990,906 | 11/1976 | Johnson et al. | 134/1 |
| 3,999,188 | 12/1976 | Yamada | 347/80 |
| 4,122,458 | 10/1978 | Paranjpe | 346/75 |
| 4,129,875 | 12/1978 | Ito et al. | 347/80 |
| 4,158,204 | 6/1979 | Kuhn et al. | 347/78 |
| 4,235,246 | 11/1980 | Weiss | 128/785 |
| 4,247,508 | 1/1981 | Housholder | 264/219 |
| 4,273,069 | 6/1981 | Huggins et al. . | |
| 4,294,805 | 10/1981 | Hodgson et al. | 423/4 |
| 4,299,239 | 11/1981 | Weiss et al. | 128/785 |
| 4,371,568 | 2/1983 | Von Tell . | |
| 4,420,446 | 12/1983 | Wieder et al. | 264/40.6 |
| 4,472,668 | 9/1984 | Mutschler et al. | 318/568 |

(List continued on next page.)

FOREIGN PATENT DOCUMENTS

| | | |
|---|---|---|
| 0431924A2 | 6/1991 | European Pat. Off. . |
| 0446934A2 | 9/1991 | European Pat. Off. . |
| 0470705A2 | 12/1992 | European Pat. Off. . |
| 2263777 | 7/1973 | Germany . |
| 549132 | 4/1979 | Japan . |
| 2111528 | 4/1990 | Japan . |
| WO9003893 | 4/1990 | WIPO . |
| WO9220505 | 11/1992 | WIPO . |

OTHER PUBLICATIONS

Abstract, from Japanese Patent No. A 4061328, published Jun. 15, 1992.

Abstract, from Japanese Patent No. A 2307737, published Mar. 6, 1991.

Database WPI, Section PQ, Week 9103, Derwent Publications Ltd., London, GB; Class P, p. 43, AN 91–020238, & SU–A–1 563 787 (Suchkov, A.G.) May 15, 1990.

R. Sweet, "High Frequency with Electrostatically Deflected Ink Jets", The Review of Scientific Instruments, vol. 36, No. 2, pp. 131–136, 1965.

C. Deckard, et al., "Solid Freeform Fabrication and Selective Powder Sintering", NAMRC Proceedings, Symposium #15, undated.

H. Kodama, "Automatic Method for Fabricating a Three–Dimensional Plastic Model with Photo–Hardening Polymer", Review of Scientific Instruments, vol. 52, No. 11, Nov. 1981.

T. Wohlers, "Creating Parts by the Layers", Cadence, pp. 73–76, Apr. 1989.

*Primary Examiner*—Steven P. Griffin
*Attorney, Agent, or Firm*—Steven J. Weissburg

[57] ABSTRACT

An apparatus and method for use in producing three dimensional components by bonding together successive layers of a porous material with droplets of a binder material. A powder is dispensed on a support surface in a layer. A vibratory mechanism vibrates the layer of dispensed powder to compact the powder.

5 Claims, 14 Drawing Sheets

U.S. PATENT DOCUMENTS

| | | | |
|---|---|---|---|
| 4,504,322 | 3/1985 | Adwalpalker et al. | 134/1 |
| 4,561,902 | 12/1985 | Lee | 134/1 |
| 4,575,330 | 3/1986 | Hull | 425/174.4 |
| 4,579,380 | 4/1986 | Zaremsky et al. | 294/119.1 |
| 4,633,804 | 1/1987 | Arii . | |
| 4,636,341 | 1/1987 | Murley | 264/37 |
| 4,642,653 | 2/1987 | Ito et al. | 346/1.1 |
| 4,665,492 | 5/1987 | Masters | 364/468 |
| 4,791,022 | 12/1988 | Graham | 428/324 |
| 4,791,434 | 12/1988 | Wills | 239/690 |
| 4,818,562 | 4/1989 | Arcella et al. | 427/53.1 |
| 4,863,538 | 9/1989 | Deckard | 156/62.2 |
| 4,876,455 | 10/1989 | Sanderson et al. | 250/560 |
| 4,929,402 | 5/1990 | Hull | 264/22 |
| 4,935,055 | 6/1990 | Aghajanian et al. | 164/66.1 |
| 4,983,427 | 1/1991 | Sansome et al. . | |
| 4,988,202 | 1/1991 | Nayar et al. | 356/394 |
| 5,053,090 | 10/1991 | Beaman et al. | 156/62.2 |
| 5,059,266 | 10/1991 | Yamane et al. | 118/313 |
| 5,076,869 | 12/1991 | Bourell et al. | 156/62.2 |
| 5,079,974 | 1/1992 | Weiss et al. | 76/107.1 |
| 5,121,329 | 6/1992 | Crump | 364/468 |
| 5,126,529 | 6/1992 | Weiss et al. | 219/121.6 |
| 5,136,515 | 8/1992 | Helinski | 364/468 |
| 5,143,663 | 9/1992 | Leyden et al. . | |
| 5,147,587 | 9/1992 | Marcus et al. | 264/22 |
| 5,203,944 | 4/1993 | Prinz et al. | 156/247 |
| 5,204,055 | 4/1993 | Sachs et al. | 419/2 |
| 5,207,371 | 5/1993 | Prinz et al. | 228/125 |
| 5,278,442 | 1/1994 | Prinz et al. | 257/417 |
| 5,281,789 | 1/1994 | Merz et al. | 219/76.15 |
| 5,301,415 | 4/1994 | Prinz et al. | 29/458 |
| 5,301,863 | 4/1994 | Prinz et al. | 228/33 |
| 5,312,456 | 5/1994 | Reed et al. | 411/456 |
| 5,340,656 | 8/1994 | Sachs et al. | 428/546 |
| 5,387,380 | 2/1995 | Cima et al. | 264/69 |
| 5,662,158 | 9/1997 | Caldarise . | |
| 5,687,788 | 11/1997 | Caldarise et al. . | |

POWDER DISPENSING APPARATUS USING VIBRATION

RELATED INVENTIONS

This application is a continuation of application Ser. No. 08/019,470, filed on Feb. 18, 1993, (abandoned) which is a continuation of application Ser. No. 07/447,677, filed on Dec. 8, 1989, now U.S. Pat. No. 5,204,055, issued on Apr. 20, 1993, the disclosure of which was incorporated by reference in application Ser. No. 08/019,470. The disclosure of Ser. Nos. 08/019,470 and 07/447,677 are incorporated herein by reference. application Ser. No. 08/596,707, filed on Feb. 5, 1996, and issued on Sep. 15, 1998, as U.S. Pat. No. 5,807,437, is a file-wrapper continuation of application Ser. No. 08/019,470 (abandoned). Thus, the present application is a continuation of both the Ser. No. 08/019,470 and the Ser. No. 07/447,677 applications, which issued as the U.S. Pat. No. 5,204,055 patent.

STATEMENT REGARDING FEDERALLY SPONSORED RESEARCH OR DEVELOPMENT

This invention was made with government support under Grant Number DDM-8913977 awarded by the National Science Foundation. The government has certain rights in the invention.

INTRODUCTION

This invention relates generally to the manufacture of tooling and prototype parts, and, more particularly, to the use of three-dimensional printing techniques using computer models therefor.

BACKGROUND OF THE INVENTION

Two needs in providing effective industrial productivity and competitiveness lie in the reduction in time required to bring new products to the marketplace and the need for providing for flexible manufacture of products in small quantities. Thus, it is desirable to provide rapid part turn-around with a minimal investment in tooling. Techniques for doing so should have the ability to tailor designs to specific tasks, to shorten the cycle time from design to manufacturing, and/or to manufacture in very small lot sizes, as low as single component, all at reasonable cost. A major contributor to the time required to bring new products to the marketplace is the time required to fabricate functioning prototypes. Rapid prototyping can shorten the product development cycle and improve the design process by providing rapid and effective feedback to the designer. Moreover, some applications require rapid prototyping of non-functional parts for use in assessing the aesthetic aspect of a design or the fit and assembly thereof.

Another major contributor to the time to bring a product to market is the time required to develop tooling, such as molds and dies. For some types of tooling such as injection molding dies, the turnaround time for the design and fabrication of a tool routinely extends to several months. The long lead times are due to the fact that tooling is often one of a kind and can be extremely complex, requiring a great deal of human attention to detail. Thus, tooling not only affects lead time, but also manufacturing costs as well. In fact, tooling costs often determine the minimum economic batch size for a given process. Prototyping requirements, tooling lead time, and tooling cost are related in that it is the combination of long lead times and high cost which make it impractical to fabricate preproduction prototypes by the same process that will be used in production.

In the past several years, there has been considerable interest in developing computerized, three-dimensional printing techniques, sometimes referred to as "desktop manufacturing" techniques where no tooling is required. One such system is known, the SLA 1 System, made and sold by 3D Systems, Inc. of Valencia, Calif. This system operates on a principle called stereolithography wherein a focused ultra-violet (UV) laser is vector scanned over the top of a bath of a photopolymerizable liquid polymer plastic material. The UV laser causes the bath to polymerize where the laser beam strikes the surface of the bath, resulting in the creation of a first solid plastic layer at and just below the surface. The solid layer is then lowered into the bath and the laser generated polymerization process is repeated for the generation of the next layer, and so on, until a plurality of superimposed layers forming the desired part is obtained. The most recently created layer in each case is always lowered to a position for the creation of the next layer slightly below the surface of the liquid bath.

An alternative approach, sometimes called Selective Laser Sintering (SLS) has also been proposed by DTM Corporation of Austin, Tex. In such system, a laser beam is used to sinter areas of a layer of loosely compacted plastic powder, the powder being applied layer by layer. The term "sintering" refers to the process by which particulates, such as powdered plastics, are caused to adhere into a solid mass by means of externally applied energy. A SLS system uses the optical energy supplied by a laser for such purpose.

Thus, a thin layer of powder is spread evenly onto a flat surface with a roller mechanism. The thin powder surface is then raster-scanned with a high-power laser beam from above. The powder material that is struck by the laser beam is fused together. The areas not hit by the laser beam remain loose and fall from the part when it is removed from the system. Successive layers of powder are deposited and raster-scanned one on top of another, until an entire part is complete. Each layer is sintered deeply enough to bond it to the preceding layer. A similar laser sintering approach has been proposed by Hydronetics, Inc. of Chicago, Ill. Another process suggested by the same company is designated as a Laminated Object Manufacturing (LOM) technique wherein thin metallic foil layers are cut out to appropriate shapes to form a part and the shaped layered pieces are laid one on top of the other and suitably bonded to form the part involved.

Another process suggested for creating 3D models and prototypes, sometimes called Ballistic Particle Manufacturing (BPM), has been proposed by Automated Dynamic Corporation of Troy, N.Y. This process uses an ink-jet printing technique wherein an ink jet stream of liquid molten metal or a metal composite material is used to create three-dimensional objects under computer control, similar to the way an ink-jet printer produces two-dimensional graphic printing. A metal or metal composite part is produced by ink-jet printing of successive cross sections, one layer after another, to a target using a cold welding (i.e., rapid solidification) technique, which causes bonding between the particles and the successive layers.

Still another technique, sometimes called Photochemical Machining, proposed by Formigraphis Engine Co., of Berkeley, Calif., uses intersecting laser beams to selectively harden or soften a polymer plastic block. The underlying mechanism used is the photochemical cross-linking or degradation of the material.

It is desirable to devise a technique for providing such layered parts which will work satisfactorily with ceramic or metal materials, or combinations of such materials with each other or with other materials, but which will also work satisfactorily with plastic particles or with other inorganic materials. Such a technique could be more universally employed for the manufacture of components from a larger variety of materials than the currently proposed techniques.

BRIEF SUMMARY OF THE INVENTION

In accordance with a preferred embodiment of the invention, powdered material, e.g., a powdered ceramic, a powdered metal, or a powdered plastic, is deposited in sequential layers one on top of the other. Following the deposit of each layer of powdered material, a liquid binder material is selectively supplied to the layer of powdered material using an ink-jet printing technique in accordance with a computer model of the three-dimensional part being formed. Following the sequential application of all of the required powder layers and binder material to form the part in question, the unbound powder is appropriately removed, resulting in the formation of the desired three-dimensional part. It is found that such technique permits complex metal, ceramic, or metal-ceramic composite parts to be effectively formed with a very high degree of resolution in a reasonably short time period.

Such technique should be particularly useful, for example, in providing for the rapid production of molds for metal casting and the rapid formation of pre-forms for metal matrix composites. Such technique can also be used with plastic materials to form plastic components or parts for various purposes.

In a further aspect of the invention, in order to achieve high quality printing at a high rate in accordance with the invention, a multiple array of on-off controlled nozzles is scanned over the surface of a bed of porous material in multiple passes using an interlacing of the printed lines which deposit the binder thereon.

A further method for achieving the fine drop placement resolution required is to utilize an array of proportionally deflected jets disposed so that at least a component of the deflection is perpendicular to the direction of fast scan of the raster. The use of proportional deflection permits the edges of an object to be contoured to create smooth surfaces or to create selected patterns which are used to fill the interiors of components.

The accuracy of drop placement is maintained by an on-line measurement of the position and velocity, or time of flight, of the jets so that an adjustment of the data file which defines the model of the component being made can be made to compensate for any changes that may be needed.

BRIEF DESCRIPTION OF THE DRAWINGS

The invention can be described in more detail with the help of the accompanying drawings wherein.

DETAILED DESCRIPTION OF THE INVENTION

Figure 1:
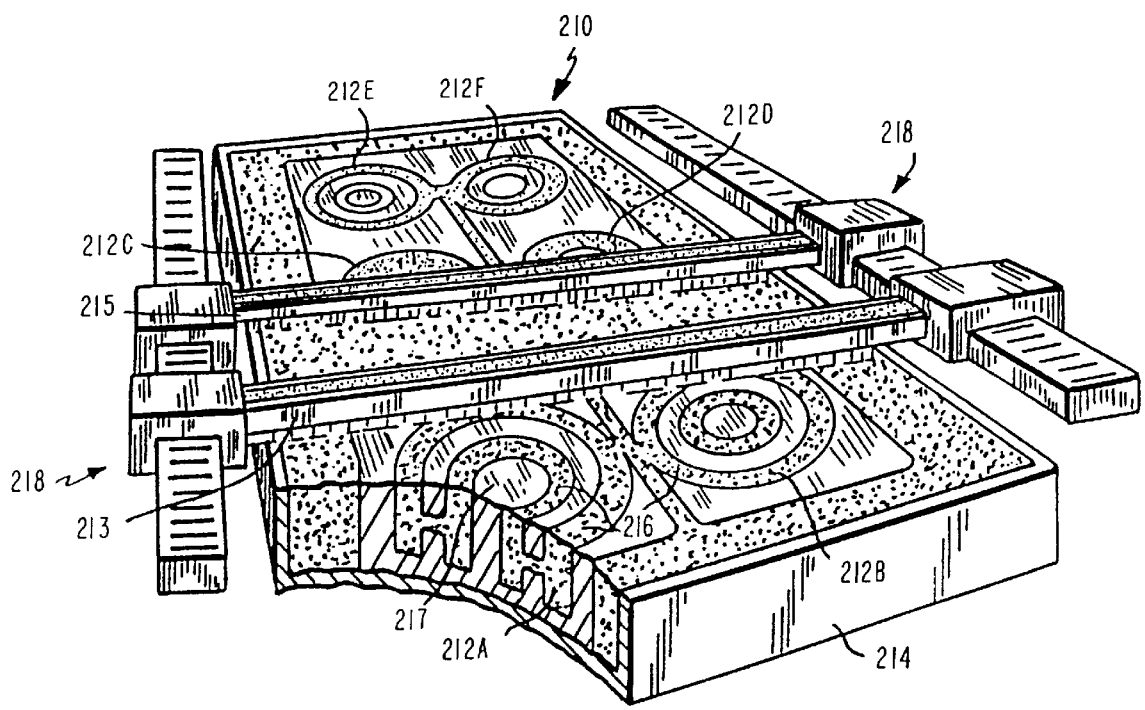
FIG. 1 shows an isometric view of one particular embodiment of the invention.

One particular embodiment of the invention is shown in FIG. 1 which depicts an apparatus 210 for forming a ceramic mold having six cavities 212A–212F which can be used for casting six substantially identical parts. A powder dispersion head 213 is driven reciprocally in a shuttle motion along the length of the mold being formed. A suitable linear stepping motor assembly 218 can be used for moving the powder distribution head 213 and the binder deposition head 215 (discussed below). The powdered material, e.g., a ceramic powder, is dispensed in a confined region, e.g., defined by a form 214, the powder being dispensed in a line as the dispensing head 213 is moved in discrete steps along the mold length to form a relatively loose layer thereof having a typical thickness of about 100–200 microns, for example. While the material is described here as a powdered material, in some applications it can be distributed in the form of fibers, for example. For convenience in describing the invention, the term powder material will be construed to include fiber material. The stepping motor can be moved at such high speeds that the motion of the head 213 will effectively be continuous in nature. Alternatively, the motor may be one which inherently provides a continuous motion, such as a servo-controlled motor. An initial layer is dispersed at the bottom of the form 214 and each subsequent layer is dispersed sequentially on the preceding layer.

An ink-jet print head 215 having a plurality of ink-jet dispensers is also driven by the stepping motor assembly in the same reciprocal manner so as to follow the motion of the powder head and to selectively produce jets of a liquid binder material at selected regions 216 which represent the walls of each cavity, thereby causing the powdered material at such regions to become bonded. The binder jets are dispensed along a line of the printhead 215 which is moved in substantially the same manner as the dispensing head 213 of the powder material, i.e., by a high speed stepping operation or by a continuous servo motor operation, in each case providing effectively continuous movement of head 215 as discussed above with reference to head 213. Typical binder droplet sizes are about 15–50 microns, for example. The powder/binder layer forming process is repeated so as to build up the mold parts layer by layer.

Figure 2:
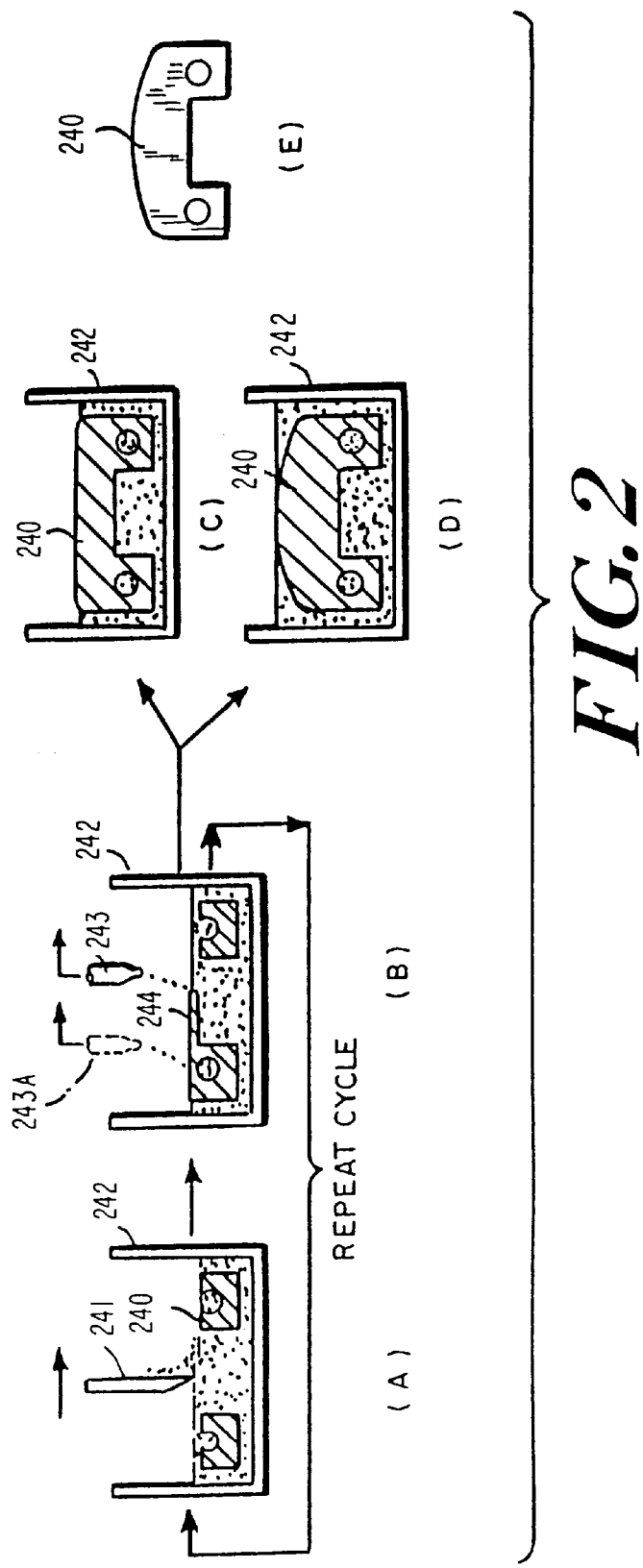
FIG. 2 shows diagrammatic views of different stages in forming a part in accordance with the invention.

A diagram showing a part being fabricated in accordance with the invention is depicted in FIG. 2 which diagrammatically depicts the flow thereof. For a part 240 in question a layer of powder is deposited from a powder dispensing head 241 into a form 242 over a previously formed layer which has already had binder material deposited therein (A). A layer of binder material is then printed onto the powder layer from binding jet head 243 to form the next layer 244 of bonded powder articles (B). Such operation is repeated for each subsequent layer. An exemplary intermediate stage of the formation of part 240 is shown at (C). When the final bonded layer is printed as shown at (D), excess unbonded powder is removed, the finally formed part itself being depicted at (E).

While the layers become hardened or at least partially hardened as each of the layers is laid down, once the desired final part configuration is achieved and the layering process is completed, in some applications it may be desirable that the form and its contents be heated or cured at a suitably selected temperature to further promote binding of the powder particles. In either case, whether a further curing is or is not required, the loose, unbonded powder particles, e.g., at regions 217 (FIG. 1), are removed using a suitable technique, such as ultrasonic cleaning, for example, so as to leave a finished part for use.

For effective use, the powder particles should be uniformly deposited at a relatively high rate, the rate being selected in accordance with the application for which the technique is used. For many useful applications the powder particles can preferably be packed at relatively high densities, while in other applications the density may be considerably lower where parts having greater porosity are desired. Known techniques used in the fields of colloidal science and powder dispersion chemistry can be used to provide the desired uniform depositions of such powders at the required rates and densities. Thus, such powders can be dispensed either as dry powders or in a liquid vehicle, such as in a colloidal dispersant or in an aqueous suspension. In the dry state, the desired compaction of particles can be achieved using mechanical vibrating compaction techniques or by applying acoustic energy, i.e., either sonic or ultrasonic vibrations, to the deposited powder or by applying a piezoelectric scraper to the deposited powder.

Figure 3:
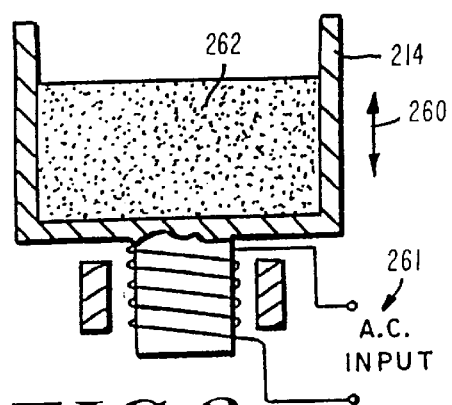
FIGS. 3, 4 and 5 show various exemplary techniques for setting the powder particles by applying mechanical vibrations and acoustic energy thereto.
Figure 5:
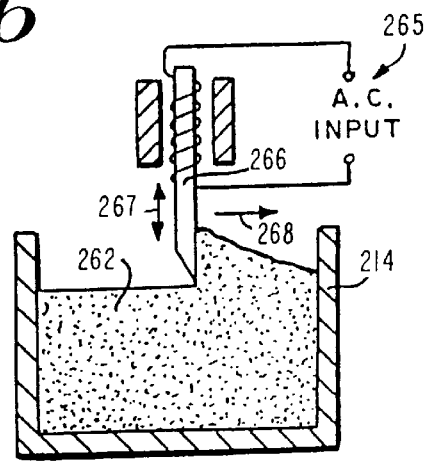
Figure 4:
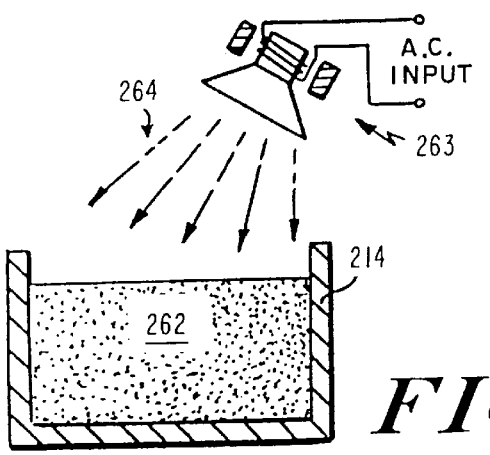

Such techniques are illustrated, for example, in FIGS. 3, 4, and 5, respectively. FIG. 3 shows form 214 which is mechanically vibrated as shown by arrow 260 using a vibrating transducer system 261 for settling the powder particles 262 therein. In FIG. 4 an acoustic transducer system 263 is used to supply acoustic energy 264 to the surface layer of powder 262 for such purpose. In FIG. 5 a vibrating transducer system 265 is used to vibrate a piezoelectric scraper 266 as shown by arrow 267 as it moves in the exemplary direction of arrow 268 to settle the powder 262.

The powder may also be deposited in a dry or in a wet form using a drop piston approach wherein a dry or moist powder is deposited on the top of a vertically movable piston and the piston is moved downwardly into a chamber, excess powder being scraped off with a suitable scraper device.

Figure 6:
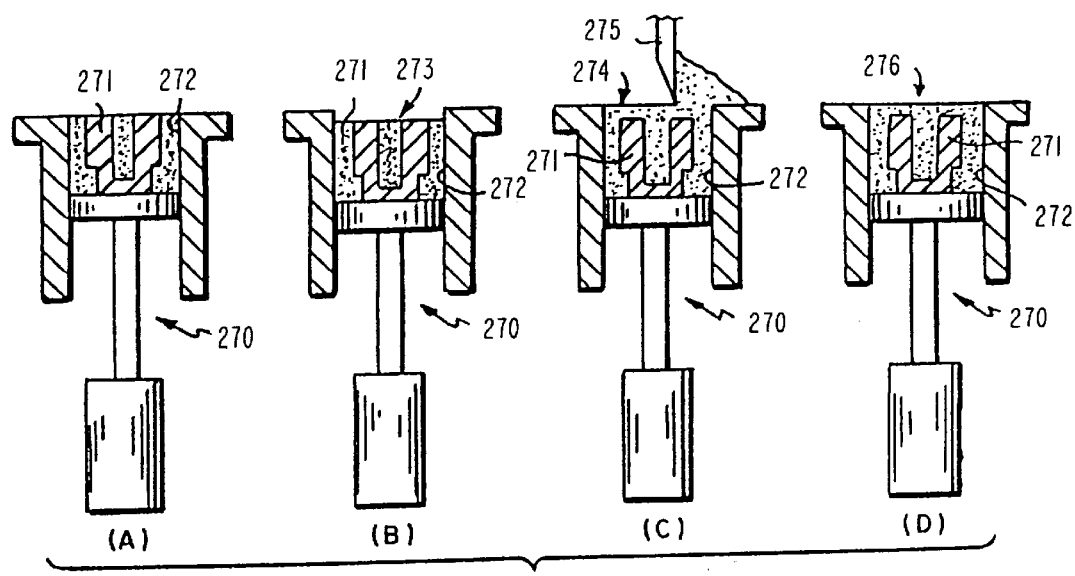
FIG. 6 shows exemplary stages in the use of a drop-piston device for depositing powder particles in accordance with the invention.

As shown in FIG. 6, a piston 270 holds the part 271 shown as partially formed within a chamber 272 at diagram (A). In order to deposit a layer of powder, the piston is moved downwardly in the chamber, leaving a region in chamber 273 at the top thereof for deposition of powder particles at diagram (B). Powder particles 274 are deposited in such region and a doctor blade 275, for example, is used to scrape off excess powder at diagram (C). The part 271 having the newly deposited layer 276 of powder thereon is then ready for the application of binder material thereto at diagram (D).

In general, it is found that larger particles, for example, of about 20 microns or greater in size, are preferably deposited in a dry state, while smaller particles, for example, of about 5 microns or smaller in size, can be deposited either in a dry state or in a wet state in a liquid vehicle.

Colloidal dispersions of particles can be obtained in a liquid vehicle by the addition of chemical dispersants. The liquid used in a wet powder dispersion technique is removed, or partially removed, before the next layer is deposited. Thus, such liquid is caused to evaporate rapidly before the ink-jet binder printing occurs. Such evaporation can be achieved, for example, by using infra-red heating, hot air heating or microwave heating techniques.

The ink-jet printing of the binder material should utilize droplets of materials the shrink characteristics of which are selected so that the dimensional tolerances of the part being made are maintained upon hardening thereof. While the binder solution must have a relatively high binder content, the viscosity thereof should be low enough so as to be able to flow through the printing head for deposit into the powder material. The binder material should be selected to penetrate the layer and to perform its binding action relatively rapidly in each layer so that the next layer of powder particles can be subsequently applied thereto. When using certain ink-jet technology the binder material may require at least a minimum electrical conductivity, particularly when using currently available continuous jet printing heads, for example, which require enough conductivity to establish charge on the binder solution droplets as they are emitted from the head. Where conductivity cannot be established in the binder, as with certain organic solvents, for example, the binder can be applied using drop-on-demand print heads.

The binder material may be such that the bonded particles have a high binding strength as each layer is deposited so that, when all the layers have been bonded, the component formed thereby is ready for use without further processing. In other cases, it may be desirable, or necessary, to perform further processing of the part. For example, while the process may be such as to impart a reasonable strength to the component which is formed, once the part is formed it can be further heated or cured to further enhance the binding strength of the particles. The binder in some cases can be removed during such heating or firing process, while in others it can remain in the material after firing. Which operation occurs depends on the particular binder material which has been selected for use and on the conditions, e.g., temperature, under which the heating or firing process is performed. Other post-processing operations may also be performed following the part formation.

The ink-jet printing mechanisms that can be used are known to the art and normally are of two types, one being a continuous jet stream print head and the other a drop-on-demand stream print head. A high speed printer of the continuous type, for example, is the Dijit printer made and sold by Diconix, Inc. of Dayton, Ohio, which has a line printing bar containing approximately 1500 jets which can deliver up to 60 million droplets per second in a continuous fashion and can print at speeds up to 900 feet per minute. In such a system, the liquid material emerges continuously from each jet nozzle under high pressure, the jet stream then disintegrating into a train of droplets, the direction of which is controlled by electric control signals.

Drop-on-demand systems, as now known to the art, generally use two droplet generation mechanisms. One approach uses a piezoelectric element which in one exemplary embodiment has the piezoelectric element attached to one wall of a liquid reservoir. A pulse applied to the piezoelectric element slightly changes the volume of the reservoir cavity and simultaneously induces a pressure wave in the liquid. Such operation causes a droplet of the liquid to be ejected from a nozzle attached to the cavity. The cavity refills by capillary action. Another approach uses an evaporative bubble wherein a small resistive heater when actuated causes some of the liquid to evaporate so as to form a vapor bubble which in turn causes a small droplet of liquid to be ejected from the cavity. The cavity is then refilled through capillary action. In general, continuous jet technology provides higher droplet deposit rates than drop-on-demand technology.

The continuous or drop-on-demand ink-jet heads may use, for example, a single jet, or an array of jets which are arranged to deposit the material in an effectively linear manner, or a combination of two or more relatively short, parallel arrays of jets arranged for parallel and effectively linear depositions thereof.

The rate at which a ceramic, metal, plastic, or composite component can be made depends on the rates used to deposit the powder and to supply the binder liquid, and on the rate at which each bonded layer hardens as the layers are deposited one on the other.

If a dry powder dispersion is utilized, the powder application step is less significant as a limiting factor in determining the overall printing rate. If powder dispersion in a liquid vehicle is used, however, the layer must be at least partially dry prior to the ink-jet application of the binder material. The drying time will depend on the specific nature of the powder, binder, and solvent used.

The dimensions of the individual portions of the component being formed, sometimes referred to as the "feature" size thereof, is primarily dependent on the size of the binder droplets used, while the tolerance on such dimensions primarily depends on the degree of the reproducibility of the droplet spread characteristics of the binder material which is utilized.

Ink-jet printing of a liquid binder using currently known ink-jet devices can provide jet droplet sizes of as low as 15 microns, for example. It is possible that even smaller droplet sizes will be practical, with the lower limit on droplet size arising from surface energy considerations in the creation of new surface area and in the increased likelihood of the clogging of small jets.

Overall part tolerance will depend not only on drop spreading, but also on material shrinkage and the reproducibility of shrinkage characteristics as well. As an example, if the binder/powder combination shrinks by 1% and the shrinkage is reproducible to within 5% of its nominal value of 1%, and overall variation due to shrinkage can be approximately 0.0005 inches/inch. The actual shrinkage that occurs during binder curing or deposition is a relatively strong function of particle rearrangement. Dimensional tolerance and particle packing can be empirically determined for the best results in each case.

Alumina, zirconia, zircon (i.e., zirconium silicate), and silicon carbide are representative ceramic materials which can be bonded using the techniques of the invention. Both natural and synthetic dispersants are available for these materials in organic vehicles. For example, alumina is very effectively dispersed by glyceride surfactants in toluene/MEK solvents, as is used for casting thin sheets of particles in the production of dielectric substrates in the electronic packaging industry. Silicon carbide, for example, can be easily dispersed in hexane if small amounts of OLOA 1200 (as obtained, for example, from Chevron Chemical Co. Oronite Additives Div. of San Francisco, Calif.) are present. OLOA is primarily used as an additive in crank case oil where it acts as a dispersant for metal particles produced by engine wear.

Organic binders have been used in the ceramics industry and are typically polymeric resins obtained from a variety of sources. They can be either water soluble, such as celluosic binders, as used in extrusion technology, or they can be soluble in only volatile organic solvents, such as the butyral resins, as used in tape casting technology. The latter water soluble systems can be removed relatively quickly and seem particularly useful in the technique of the invention. Another type of organic binder would be a ceramic precursor material such as polycarbosilazane.

Inorganic binders are useful in cases where the binder is to be incorporated into the final component. Such binders are generally silicate based and are typically formed from the polymerization of silicic acid or its salts in aqueous solution. Another exemplary inorganic binder which can be used is TEOS (tetraethylorthosilicate). During drying, the colloidal silica aggregates at the necks of the matrix particles to form a cement-like bond. During firing, the silica flows and acts to rearrange the matrix particles through the action of surface tension forces and remains after firing. Soluble silicate materials have been used as binders in refractory castable materials, for example, and have the advantage, when used in the technique of the invention, of producing substantially the same type of molded refractory body that is used in the casting industry.

In some applications, it may be preferable that the binder harden relatively rapidly upon being deposited so that the next layer of particles placed on a surface of the previous layer is not subject to particle rearrangement due to capillary forces. Moreover, a hardened binder is not subject to contamination from solvents which may be used in powder deposition. In other cases, it may not be necessary that the binder by fully hardened between layers and a subsequent layer of powder particles may be deposited on a previous layer which is not yet fully hardened.

Where hardening occurs at the time the binder is deposited, thermal curing, i.e., evaporation of the binder carrier liquid, for such purpose would generally require that the component being formed be warmed as the printing of the binder material is performed, while the printhead itself is cooled so that unprinted binder material in the reservoir of the ink-jet head retains its desired properties. Such hardening can be achieved by heating the binder material indirectly, as by heating the overall apparatus in which the part is being formed using an appropriate external heat source, for example, or by heating the binder material directly as by applying hot air to the binder material or by applying infra-red energy or microwave energy thereto. Alternatively, a variety of thermally activated chemical reactions could also be used to harden the binder. For example, gelation of alkali silicate solutions can be made to occur by a change in pH accompanying the decomposition of organic reagents. Thus, a mixture of alkali silicate and formamide could be printed on to a hot component being formed. The rapid increase in temperature would greatly increase the formamide decomposition rate and, therefore, rapidly change the pH of the binder. Other thermally or chemically initiated techniques for hardening of the binder upon deposit thereof could be devised within the skill of those in the art.

While liquid and colloidal binder materials have been discussed above, in some applications binder material may be deposited in the form of binder particles entrained in a liquid. Such binder materials can be supplied via specially designed compound ink-jet structures capable of providing such entrained binder materials. An example of such a composite structure is discussed, for example, in the article "Ink-Jet Printing," J. Heinzle and C. H. Hertz, Advances In Electronics and Electron Physics, Vol. 65.

Moreover, in some applications in the fabrication of a part, the binder material which is used need not be a single binder material, but different binder materials can be used for different regions of the part being formed, the different materials being supplied by separate binder deposition heads. A dual head system is shown in FIG. 2 wherein a second head 243A is depicted in phantom therein at (B).

Many possible combinations of powder and binder materials can be selected in accordance with the invention. For example, ceramic powders or ceramic fibers can be used with either inorganic or organic binder materials or with a metallic binder material; a metal powder can be used with a metallic binder or a ceramic binder; and a plastic powder can be used with a solvent binder or a plastic binder, e.g., a low viscosity epoxy plastic material. Other appropriate combinations of powder and binder materials will occur to those in the art for various applications.

One useful application of the invention lies in the printing of molds for metal casting, particularly when the mold has a relatively complex configuration. Currently, complex, high precision castings are made by lost-wax casting, or investment casting. The process begins with the fabrication of an aluminum die which is used to mold wax positives of the part to be cast. The die is usually made by electric discharge machining. Wax positives are then made and connected together by hand with wax runner systems to form a tree. If the part is to have internal voids, a ceramic core is included in the wax positives. The tree is then dipped repeatedly into ceramic slurries with a drying cycle between each dipping operation. Following a final dry, the wax is melted and burned out of the shell mold and the mold is finally ready for casting. In its basic form, such lost-wax casting technique has long been used in the art.

Figure 7:
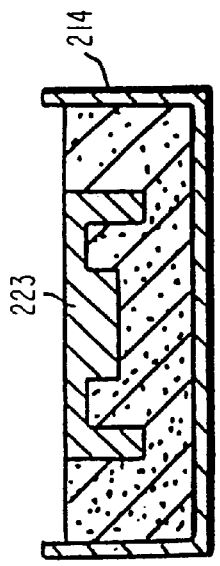
FIGS. 7 and 8 show diagrammatic views of the formation of a part having reentrant features.
Figure 8:
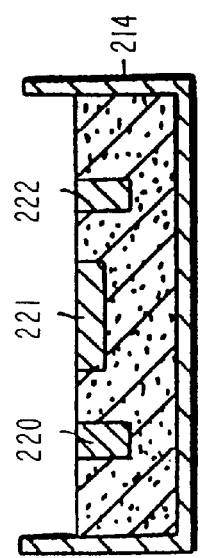

With the technique of the invention, a ceramic shell mold can be fabricated directly to its final shape with no wax positives needed at all. The internal cavities can be fabricated by leaving the binder material out of these areas. The loose, unjointed powder will then wash out of the mold through the same passageways that will later admit molten metal in the final mold. FIGS. 7 and 8 show diagrammatic views of the formation of a part having reentrant features. Thus, in FIG. 7, the binder material is printed at three selected regions 220, 221 and 222 for an initial set of sequential layers, while, for a final set of sequential layers, the selected region 223 encompasses all three previously formed regions as shown in FIG. 8. For the printing of molds, typical powder materials, as discussed above, might include alumina, silica, zirconia, and zircon, for example. A typical binder would be colloidal silica. Moreover, the techniques of the invention can be used to form the cores only.

When making molds with core regions, it may be advantageous to use one particular binder material for the main body of the mold and a modified binder material in the core regions thereof, the depositing of the binder at the core regions requiring the use of a second printhead, for example. The technique of the invention has at least two advantages over lost-wax techniques for the creation of molds, one lying in the reduction in cost for small and moderate batches of parts and the other in the ability to produce a large variety of different molds and other parts with a relatively short turnaround time.

Figure 9:
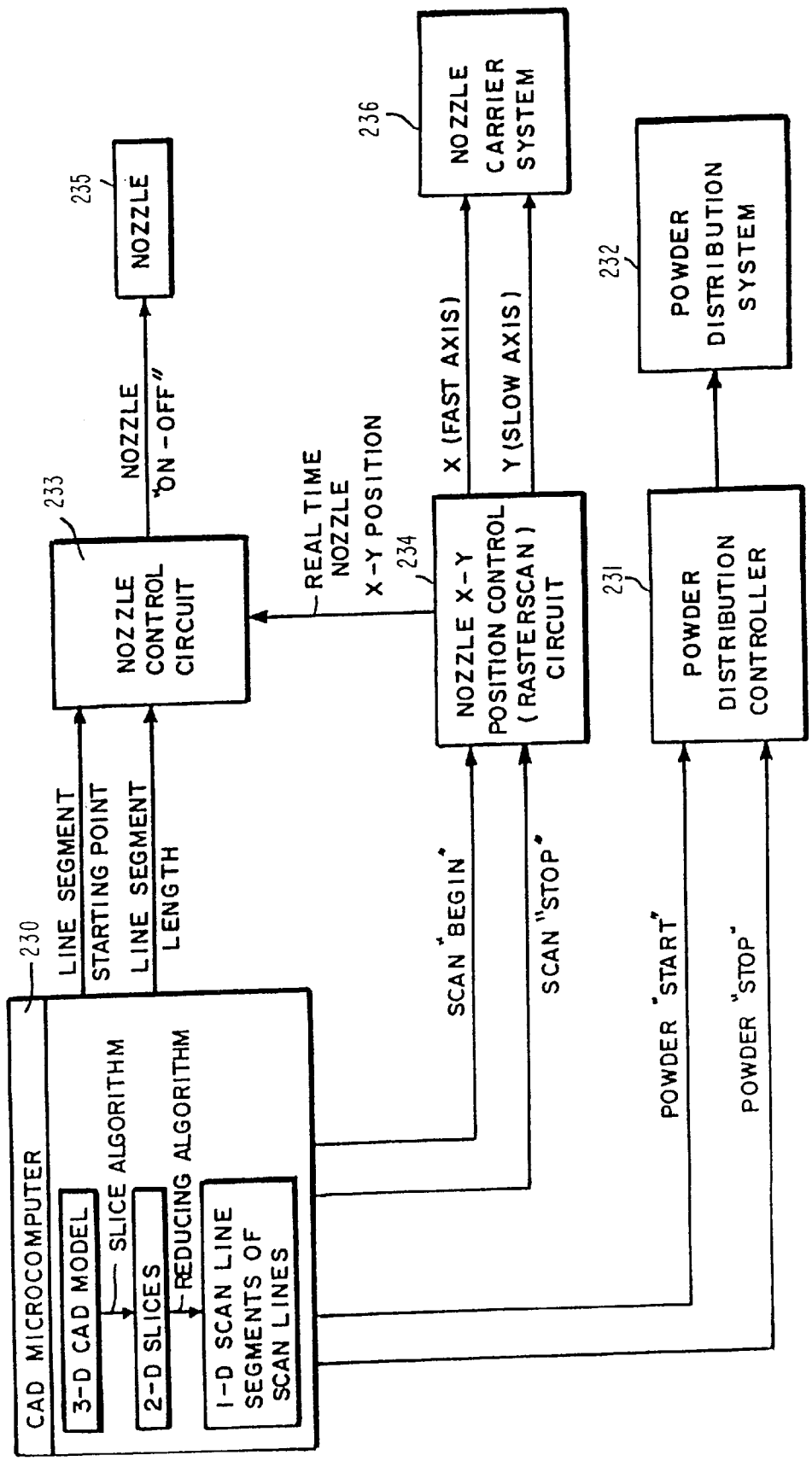
FIG. 9 shows a block diagram of an exemplary system which can be used in practicing the invention.
Figure 11:
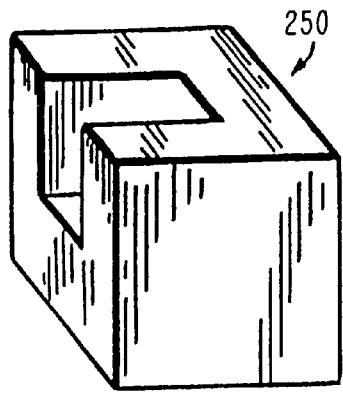
FIGS. 11 and 12 show isometric views of an exemplary 3-D model and the 2-D slices thereof, respectively, of a part to be formed in accordance with the invention.
Figure 12:
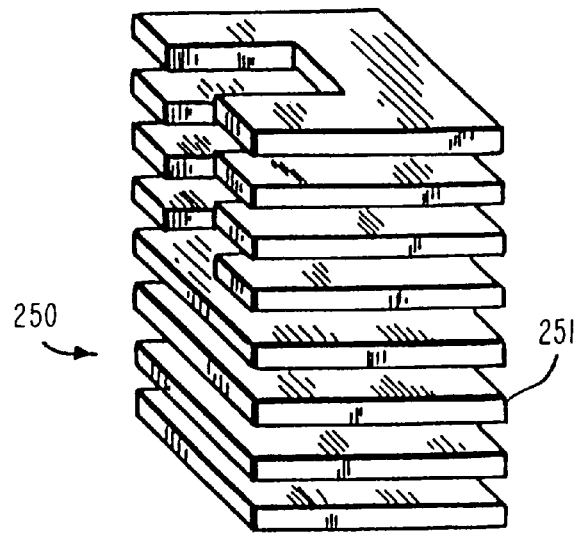

A relatively simple example of a system for performing the above powder distribution control operation and the nozzle control operation for the binder material is discussed with reference to the block diagram of FIG. 9 and the flow chart of FIG. 10. As seen in FIG. 9, a microcomputer 230 of any type which is usable for conventional computer-aided-design (CAD) operations, as would be well-known to the art, can be suitably programmed for the purpose of the invention. The microcomputer 230 is used to create a three-dimensional (3-D) model of the component to be made using well-known CAD techniques. An exemplary computerized 3-D model 250 is depicted in FIG. 11. A slicing algorithm is used to identify selected successive slices, i.e., to provide data with respect to selected 2-D layers, of the 3-D model 250 beginning at a bottom layer or slice thereof, for example. Exemplary layers 251 of the model 250 are depicted in the exploded view of FIG. 12. The development of a specific slicing algorithm for such purpose is well within the skill of those in the art.

Figure 13:
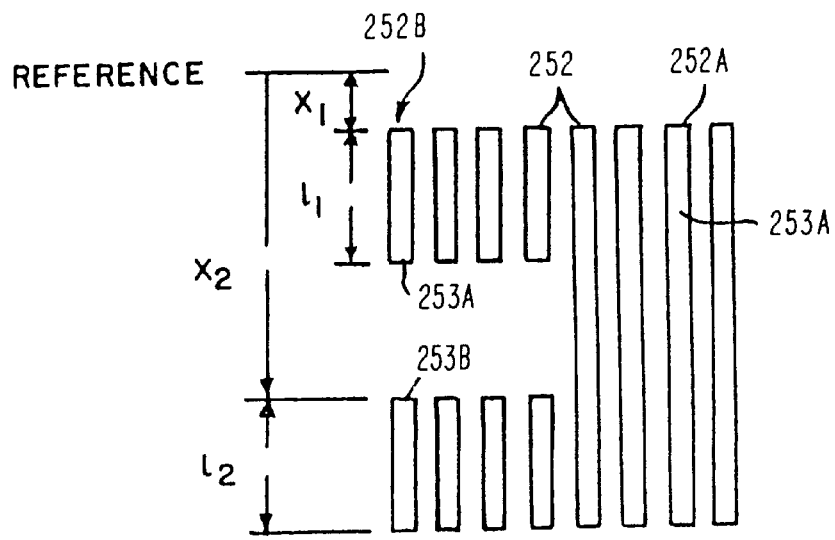
FIG. 13 shows a plan view of the 1-D line segments of a 2-D slice of the model shown in FIGS. 11 and 12.

Once a particular 2-D slice has been selected, the slice is then reduced to a series of one-dimensional (1-D) scan lines thereof as depicted in the plan view of FIG. 13. The development of a suitable reducing algorithm for such purpose would also be well within the skill of the art. Each of the scan lines 252 can comprise a single line segment (e.g., segment 253A of scan line 252A) or two or more shorter line segments, (e.g., segments 253B of scan line 252B), each line segment having a defined starting point on a scan line and a defined line segment length. For example, the line segments 253B have starting points at $x_1$ and $x_2$, respectively, as measured from a reference line, and lengths $l_1$ and $l_2$, respectively, as measured from their starting points $x_1$ and $x_2$.

The microcomputer 230 actuates the powder distribution operation when a particular 2-D slice of the 3-D model which has been created has been selected by supplying a powder "START" signal to a powder distribution controller circuit 231 which is used to actuate a powder distribution system 232 to permit a layer of powder for the selected slice to be deposited as by a powder head device in a suitable manner as discussed above. For example, the powder is deposited over the entire confined region within which the selected slice is located. Once the powder is distributed, the operation of powder distribution controller is stopped when the microcomputer 230 issues a powder "STOP" signal signifying that powder distribution over such region has been completed.

Microcomputer 230 then selects a scan line, i.e., the first scan line of the selected 2-D slice and then selects a line segment, e.g., the first 1-D line segment of the selected scan line and supplies data defining the starting point thereof and the length thereof to a binder jet nozzle control circuit 233. For simplicity in describing the operation it is assumed that a single binder jet nozzle is used and that such nozzle scans the line segments of a slice in a manner such that the overall 2-D slice is scanned in a conventional raster scan (X-Y) operation. When the real time position of the nozzle is at the starting point of the selected line segment, the nozzle 235 is turned on at the start of the line segment and is turned off at the end of the line segment in accordance with the defined starting point and length data supplied from computer 230 for that line segment. Each successive line segment is similarly scanned for the selected scan line and for each successive scan line of the selected slice in the same manner. For such purpose, the nozzle carrier system 236 starts its motion with a scan "BEGIN" signal from microcomputer 230 so that it is moved both in the X axis (the "fast" axis) direction and in the Y axis (the "slow" axis) direction. Data as to the real time position of the nozzle carrier (and, hence, the nozzle) is supplied to the nozzle control circuit 234. When the complete slice has been scanned, a scan "STOP" signal signifies an end of the slice scan condition.

As each line segment is scanned, a determination is made as to whether nozzle operation has occurred for all line segments of a particular scan line of the selected slice. If not, the next line segment is scanned and the nozzle control operation for that line segment is performed. When nozzle operation for the final line segment of a particular scan line has been completed, a determination is made as to whether the scan line involved is the final scan line of the selected slice. If not, the next scan line is selected and the scanning and nozzle control process for each successive line segment of such scan line of the slice is performed. When nozzle operation for the final scan line of a particular slice has been completed, a determination is then made as to whether such slice is the final slice of the overall 3-D model. If not, the next slice is selected and the overall process for each line segment of such scan line thereof is rejected, including the powder deposition and nozzle binder deposition required for all the scan lines thereof. When the binder material has been supplied the final slice of the 3-D model, the operation is completed.

Figure 10:
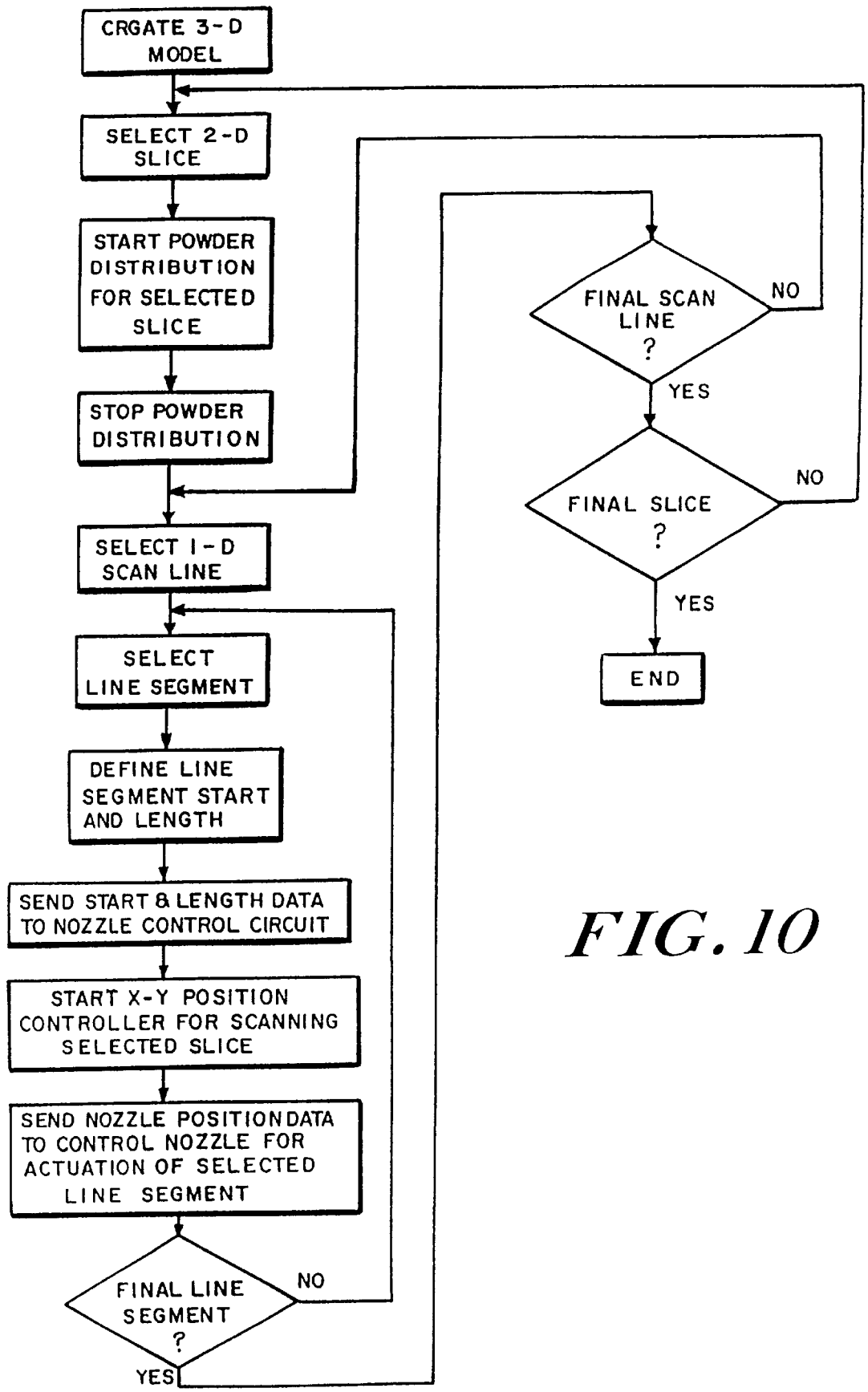
FIG. 10 shows an exemplary flow chart of the steps used in the system of FIG. 8 to practice the invention.

The necessary programming required to implement the flow chart of FIG. 10 using the components of FIG. 9 would be well within the skill of the art and need not be discussed in further detail. Such an approach can be used for a single nozzle as described above and can be readily adapted for use with a binder head having multiple nozzles, e.g., an array of nozzles for providing an effective linear deposition of binder material, or a plurality of relatively shorter, multiple arrays thereof.

In addition to the above discussed embodiments of the invention, further variations or modifications of the techniques disclosed above will occur to those in the art. For example, the binder, rather than being applied in a wet state, can be applied in a dry state using materials having a low melting point so that, when applied and heated, the melted material penetrates the powder particles and when hardened bonds them together. Further, two or more different types of powder particles can be applied via two or more separate powder dispersion heads so as to deposit the different powders at different regions of the part being formed. The powder at such regions can then be bonded using the same or different binder materials so that different physical characteristics can be obtained at such different regions. Other modifications or extensions of the invention may occur to those in the art within the spirit and scope thereof. Hence, the invention is not to be construed as limited to the specific embodiments described above, except as defined by the appended claims.

A further fundamental requirement that must be satisfied if three dimensional printing techniques are to be capable of manufacturing large quantities of product is to simultaneously satisfy the need to produce components at high rate and with high quality. Control of the quality of the part includes the control of dimensions and the control of its surface finish. Another aspect of component quality control is the control of the internal structure of the component so as to yield certain desired properties thereof, including a desired isotropic nature of the part, or a desired anisotropic nature of the part.

The rate at which parts can be created in three dimensional printing processes can be understood by recognizing that, typically, each cubic centimeter of binder that enters the powder bed binds approximately 1 cubic centimeter of powder and creates a portion of the part of approximately 2 cubic centimeters in volume. Thus, the overall volume of a part created is roughly twice the volume of binder deposited, the total volume varying depending on the type of powder used, so that it can be more or less than twice the volume of binder deposited. The attainment of a high production rate in a three dimensional printing process thus depends on depositing the binder at a high volume flow rate.

Figure 14:
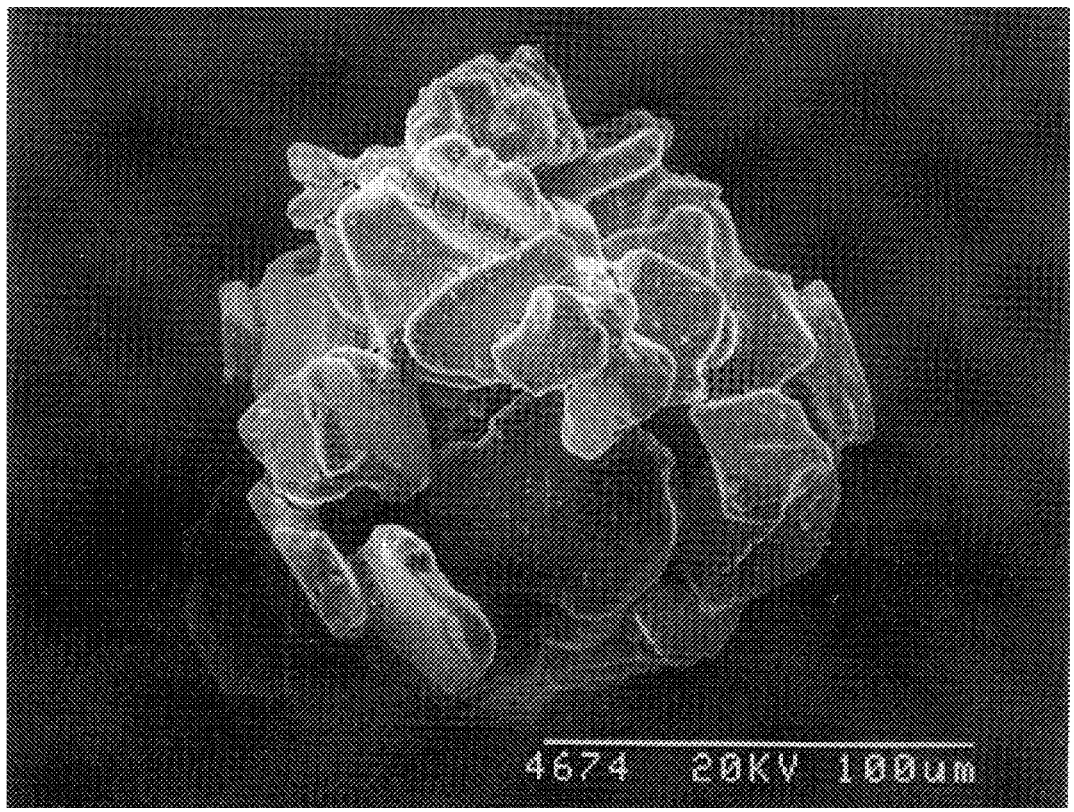
FIG. 14 shows a photomicrograph taken in a scanning electron microscope of an exemplary "primitive" element formed by the interaction of a single droplet of binder with powder.
Figure 15:
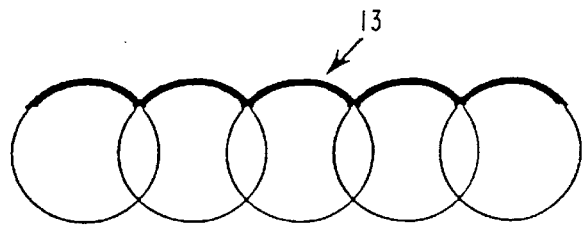
FIG. 15 shows a diagrammatic illustration of the nature of a surface defined by the overlap of droplets in a three dimensional printing process where the overlap is relatively coarse.
Figure 16:
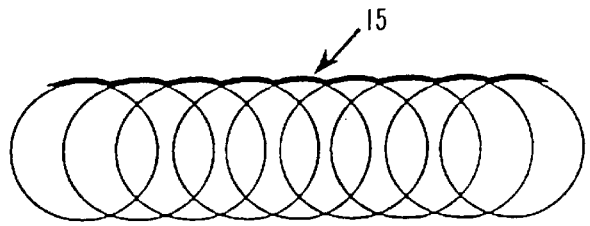
FIG. 16 shows a diagrammatic illustration of the nature of a surface defined by the overlap of droplets in a three dimensional printing process where the overlap is finer than in FIG. 2.

When the binder is delivered using ink-jet printing techniques as described above, each droplet of binder enters the powder bed and joins together a number of powder particles to form a generally spherical "primitive" building element. FIG. 14 shows a micrograph of an exemplary spherical "primitive" element which is about 120 microns in diameter. The primitive shown therein was made by printing a single 80 micron diameter droplet of binder into a bed of powder. The binder used was colloidal silica and the powder was an alumina powder having an average particle size of 30 microns. As successive droplets are deposited, these spherical building elements overlap to form the finished component. The surface finish of the finished part is largely determined by the placement of the individual droplets and how they overlap. FIG. 15 shows a portion of a component where five droplets, shown in a simplified diagrammatic fashion, have been printed with some, relatively small, overlap. In FIG. 15, each of the circles represent diagrammatically a generally spherical building element of the type shown in FIG. 14 which results from an individual binder droplet. The surface of the printed part is defined by the surface 13, which can be seen to be somewhat rough due to the nature of the contours of the primitives. By contrast, FIG. 16, shows diagrammatically a portion of a component comprising a plurality of spherical elements which have been printed with a higher degree of overlap with the result that the surface 15 is relatively smoother than the surface 13. The problem of creating high quality parts at a high production rate can be seen to be a problem of how to deposit droplets at a relatively high rate while retaining the ability to determine and control the location of the droplet placement.

The requirements for a high production rate with high quality in a three dimensional printing process provide a significantly different challenge than the conventional printing of ink on paper. One significant difference is that in printing on paper it is the general practice to move the paper at high speeds past a stationary printhead. In three dimensional printing it is preferable, and often necessary, to move the printhead past a stationary bed of porous material because the bed of porous material is often relatively large and massive. Another difference is that, in conventional printing of ink on paper, the droplet separation needed to achieve high resolution printing is considered to be about 300 dots per inch (dpi). Thus, if the droplet position can be effectively controlled to occur at intervals of 1/300 inch, or approximately 85 microns, high resolution printing can be accomplished. However, such a 300 dpi droplet placement would be quite insufficient for the creation of three dimensional components. First, a 300 dpi placement would mean that the dimensions of the three dimensional object could only be controlled to within ±85 microns. Second, the surface finish of the object would be quite rough. For example, if the primitives of FIG. 15 represented primitives of 120 micron diameter and are placed 85 microns apart, the resulting surface would have a root-mean-square (RMS) roughness of approximately 6.0 microns and would result in a fairly rough surface. In fact, then the creation of components and surfaces in three dimensional printing processes is more complex than the situation represented by FIGS. 15 and 16 in that it is a 3-D problem, while conventional printing of ink on paper is a 2-D problem. Thus, in three dimensional printing, the placement of droplets must satisfy the requirement that the overlap between droplets must serve to bind together a self-supported component in three dimensions. In contrast, in conventional printing of ink on paper, only a 2-D image needs to be defined, and further, the paper itself provides the physical support for the image.

Figure 17:
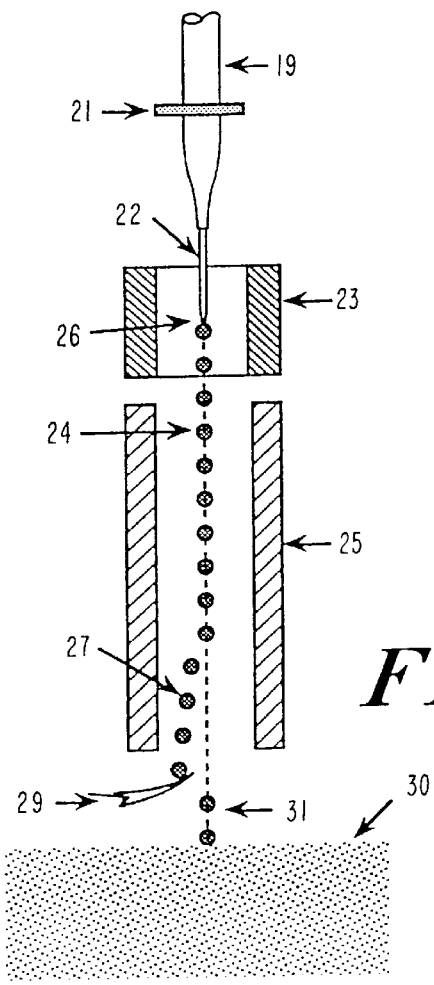
FIG. 17 shows a schematic illustration of an exemplary on-off continuous-jet printhead.

In an exemplary embodiment of this aspect of the invention, continuous-jet ink-jet printing technology is used to deliver the binder to the bed of porous material. Continuous-jet technology is known to the art and FIG. 17 shows a diagram of an exemplary continuous-jet structure where the control of the droplets supplied therefrom is arranged to be controlled in an on/off manner. A pressurized fluid is emitted from a nozzle 19 in a continuous stream 22. Piezo-ceramic element 21 causes nozzle 19 to vibrate at a selected frequency so as to promote the breakup of the stream into droplets 24. The breakup happens at a particular position 26 along the length of the stream which is arranged to occur within a charging cell 23. When a voltage is applied to the charging cell to produce a voltage between the slightly conductive stream of liquid 22 and the charging cell, the droplets acquire a capacitively induced charge. When charged droplets 27 enter the high electric field between plates 25, the electric field being created by a constant voltage applied across such plates, the droplets are deflected and caught by a catcher element 29 and removed from the printhead. When no voltage is applied between the conductive stream of liquid and the charging cell, the droplets 31 are not charged and travel straight through and proceed to the target 30. In this manner, a continuous-jet printhead can be turned on and off by turning the voltage applied to the charging cell on and off. Since the charge on the droplets depends on the voltage applied between the droplet stream and the charging cell at the moment of break-off, the droplets may be individually controlled.

Figure 18:
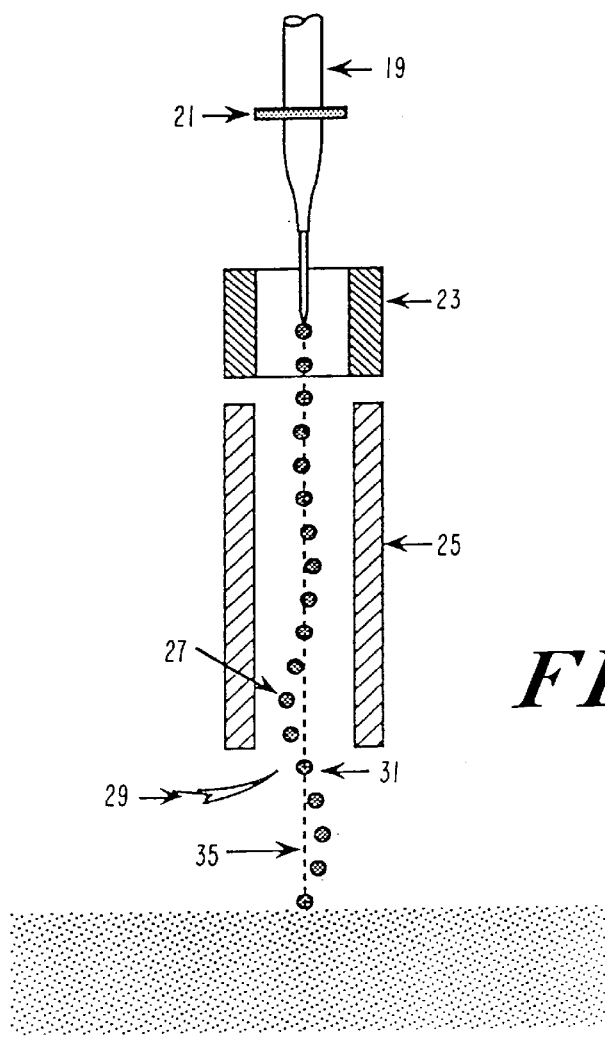
FIG. 18 shows a schematic illustration of an exemplary proportionally deflected continuous-jet printhead.

Continuous-jet printing may also be practiced in a proportional deflecting mode where the jet is deflected through a range of positions in order to deliver droplets at specified locations. In FIG. 18, for example, a sinusoidal voltage is applied to a charging ring 23 with the result that successive droplets are charged by different amounts in a sinusoidally varying pattern. As these droplets enter deflection plates 25, they are deflected by an amount proportional to their charge. It should be noted that droplets can be charged either positively or negatively, resulting in deflections on both sides of a line 35 which would be traveled by uncharged droplets. Controlling the voltage at the moment of break-off therefore allows for control of the landing position of the droplet. Applying a large voltage at the moment of break-off will cause a droplet to be deflected into a catcher element 29 as in the case of the on-off printhead of FIG. 17.

Figure 19A:
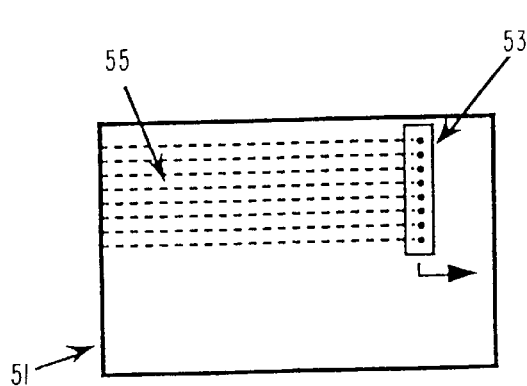
FIGS. 19(A) and 19(B) show an exemplary three dimensional printing pattern using an interlaced scan of an array of on-off jets.
Figure 19B:
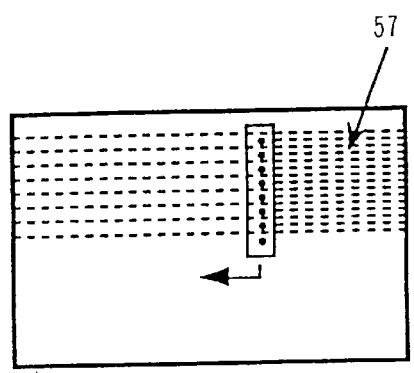

One aspect of the current invention is to provide for precise drop placement with high deposition rates utilizing arrays of ink-jets, such as an array of binary continuous jets in a single printhead structure. In this embodiment, the printhead is scanned back and forth over the surface of the powder bed. Linear arrays of such binary continuous jets can be fabricated with nozzle spaces as small as 100 microns. Such linear arrays are fabricated by Diconix/Kodak Corporation of Dayton, Ohio. While arrays of such spacing are satisfactory for moderate resolution printing of ink on paper, 100 micron drop placement resolution is insufficient for three dimensional printing. In order to provide the drop placement resolution needed for high quality three dimensional printing, in accordance with the invention, multiple passes of the printhead are made over the surface of the powder bed using an interlacing of the binder print lines as shown in FIG. 19(A) and FIG. 19(B). In a typical application, a printhead structure having a linear array 53 of eight 50 micron diameter nozzles with 100 micron spacing between nozzles can be employed. In FIG. 19(A), the printhead is shown scanning from left to right over a bed 51 of porous material. Tracks 55 depict the impact areas of the deposited binder droplets.

In FIG. 19(B) the printhead 53 is shown as having been moved downward by one-half a nozzle spacing and then moved to scan from right to left. Tracks 57 depict the impact areas of both the left to right and the right to left passes of the printhead.

In a typical application, it would be necessary to scan the printhead over the surface of the powder at a very high rate in order not to provide excessive binder to the powder bed which would result in an undesired bleeding of the binder in the powder. For example, if a layer of 200 microns thickness were being printed, the desired amount of binder per unit of deposition would be approximately 0.01 $cm^3/cm^2$. This amount of binder would fill up the void space in a bed of powder for a typical void space of 50%. Typically, the stream exiting from a 50 micron diameter nozzle would create 80 micron droplets at a rate of approximately 60 kilohertz. If the nozzle spacing is 100 microns and one interlacing pass is made, as shown in FIG. 19(B), the printhead would have to traverse at a speed of approximately 3.0 meters/second. This speed would result in the deposition of droplets at spacings of 50 microns along the direction of fast axis travel. Droplets would then be deposited on a roughly square array of 50 microns on a side, leading to material properties that are similar in the two directions within a printed layer. If the speed were lower than 3.0 meters/sec and all droplets were printed, too much binder would be deposited and bleeding would result. Alternatively, a lower traverse speed could be used if not all droplets were printed. A similar interlaced raster pattern could be created with a printhead that delivered droplets with on-off control by drop-on-demand printhead technology.

Figure 20A:
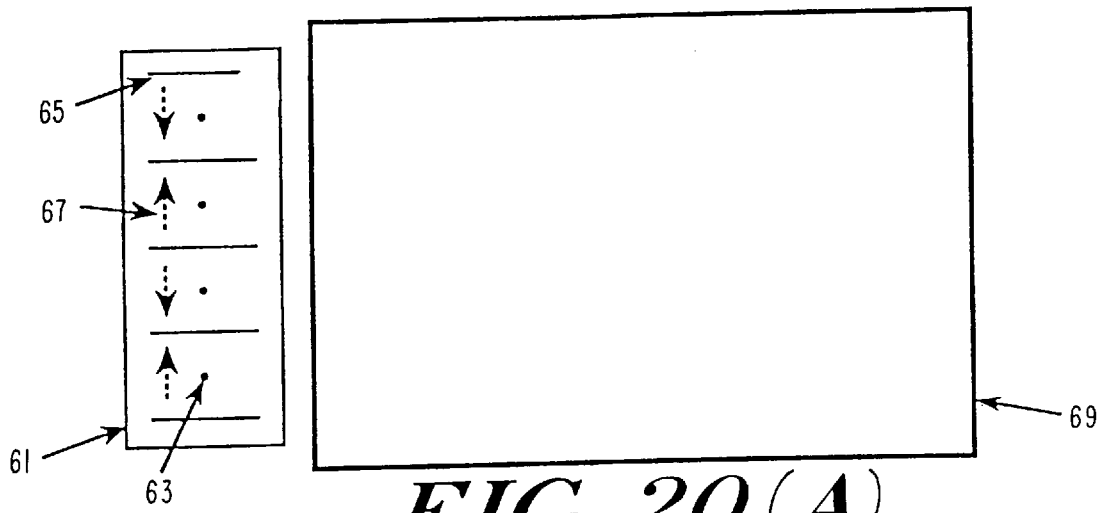
FIGS. 20(A) through 20(C) show an exemplary three dimensional printing pattern using an array of proportionally deflected jets.

Another embodiment of the current invention utilizes an array of proportionally deflected jets. In this case, the array of proportionally deflected jets is again scanned back and forth over the surface of the powder bed. The proportional deflection of the jet allows for a precise placement of the droplets in the powder bed. FIG. 20(A) shows an exemplary printhead structure 61 having a linear array of four nozzles 63 oriented perpendicular to the direction of fast scan of a raster pattern over a print area 69. Each jet is located within a set of deflection plates 65 so that the jet may be proportionally deflected along the direction of the linear array and perpendicular to the direction of fast scan of the printhead. The polarity of the plates 65 is alternated with the result that the electric field, represented by arrows 67 alternates between adjacent plates. Typically, the jet diameter might be 50 microns and the jets might be 3 millimeters apart. It is understood that for the purposes of illustration only, the scale used in FIG. 20(A) is not exact, but is meant to show that the spacing between jets is typically much larger than the jet diameter. Because of the need to dispose the jets between a pair of plates 65, it is difficult to have the spacing between jets very much smaller than 3 millimeters.

Figure 20B:
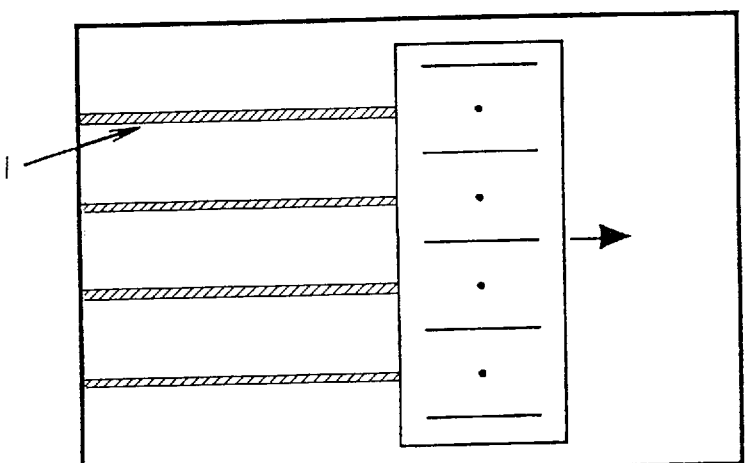
Figure 20C:
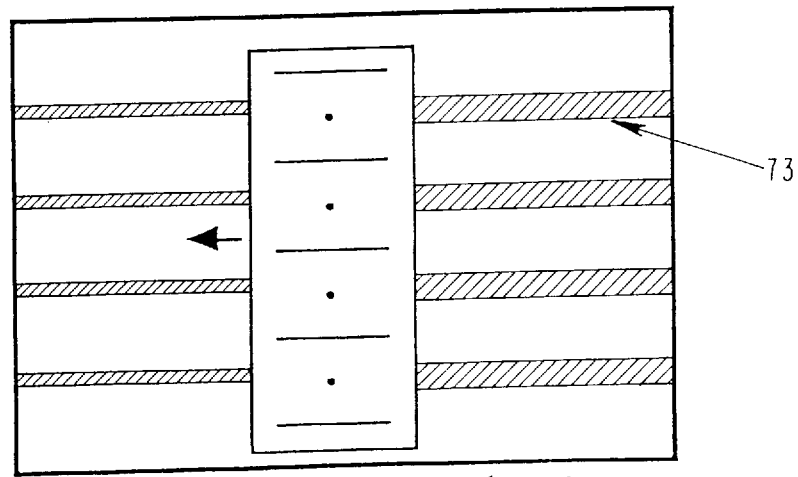

The deflection of the jets can be such as to cover the full range of distance between adjacent jets so that the entire area 69 can be printed with one pass. However, when a jet is deflected through a relatively large angle, errors in jet deflection can be difficult to control. These errors include both aerodynamic errors and electrical errors relating to the charging of the droplets. Thus, it is preferable, in accordance with the invention, to use only a relatively small amount of deflection of the jet so as to retain good accuracy in the droplet placement. In such a case, a single pass of the printhead does not cover the full area so that an interlacing scan pattern is needed. As an example, a single jet might be deflected so as to cover a printing area of 200 microns in width, so that 15 interlaced patterns would then allow for a complete printing of areas with an array having a 3 mm jet spacing. FIG. 20(B) shows the printhead 61 traveling from left to right, each proportionally deflected stream covering a relatively narrow path 71 as the printhead travels. FIG. 20(C) shows the printhead having been displaced downward and traveling from right to left and depositing binder over the lower portion of the path 73. It should be noted that the deflection can be to both sides of the position defined by an uncharged droplet, as was discussed in the context of FIG. 18. Alternatively, the deflection can be just to one side of the position defined by an uncharged droplet. In the latter case, it is possible to configure the printhead to catch uncharged droplets, while in the former case, uncharged droplets will be printed.

The use of proportional deflection allows for very fine control over the drop placement position in a direction perpendicular to the direction of fast scan of the raster. Another advantage of the use of proportional deflection is that the scanning speed of the printhead can be substantially reduced. This has the beneficial effect of providing finer resolution of drop placement along the direction of fast scan of the raster as well as making the equipment easier to fabricate. The finer resolution along the fast axis may be understood by noting that the requirement for 3-D printing is to deposit a specified amount of binder per unit area of printing for any particular layer thickness. As the binder droplets are displaced lateral to the fast axis, an individual stream covers more area. As a result, the fast axis can be slowed down. Since the droplet generation rate for a given nozzle configuration is fixed, a slower fast axis travel results in a higher number of droplets per unit length along the fast axis with the consequence of providing finer resolution.

Figure 21A:
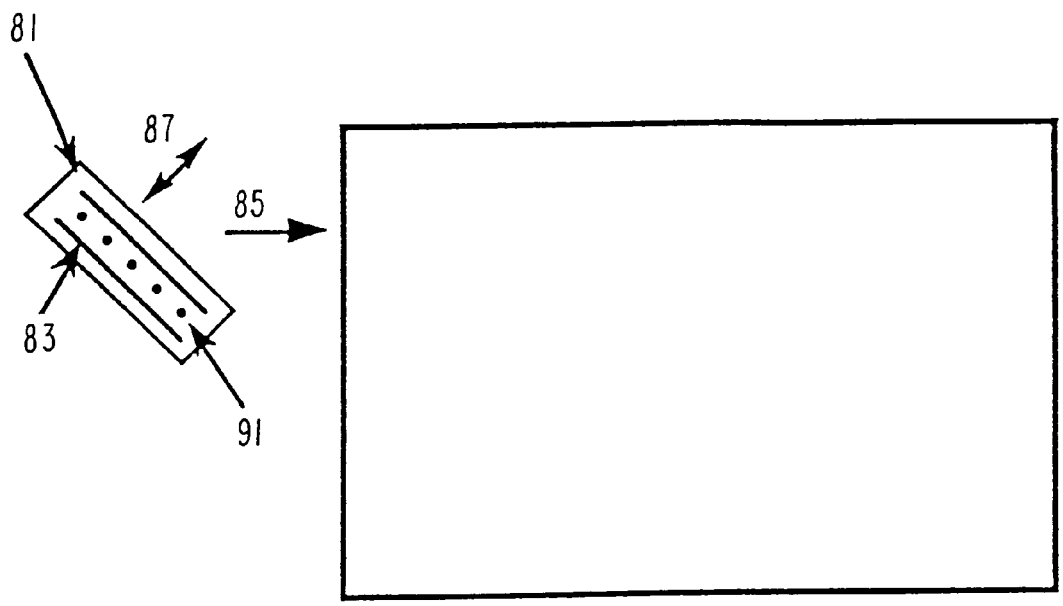
FIGS. 21(A) and 21(B) show an exemplary three dimensional printing pattern using an array of proportionally deflected jets where the array is disposed at an angle with respect to the direction of fast scan of the printhead.
Figure 21B:
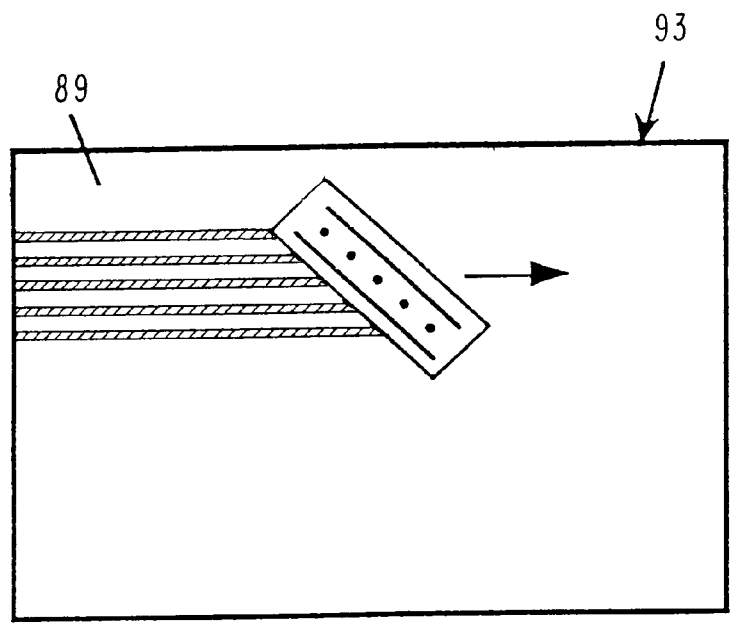

Other configurations of arrays of proportionally deflected jets are possible. FIG. 21(A), for example, shows a printhead structure 81 having an array of five jets 91 which is mounted at an angle with respect to the fast axis of scanning. The advantage of such an approach is that it eliminates the need for a high voltage deflection plate to be disposed between each nozzle. Rather, a single set of plates 83 can serve all nozzles and cause a deflection indicated by arrow 87 which is perpendicular to this set of plates. This deflection is at an angle, typically 45 degrees, with respect to the direction of fast axis scan indicated by arrow 85. The deflection thus has a vectorial component which is perpendicular to the direction of fast axis scan and, therefore, by appropriate computation can be set up to create a wide variety of patterns. FIG. 21(B) shows the printhead 81 as it scans across a print area 93 leaving binder print tracks 89. A further advantage of this approach is that the jets in the array can be relatively closely spaced and, therefore, fewer interlaced scanning lines (and, in some cases no interlaced scan lines) would be needed to cover the entire print area than would be needed, for example, in the arrangement shown in FIGS. 20(A), 20(B) and 20(C).

Figure 22A:
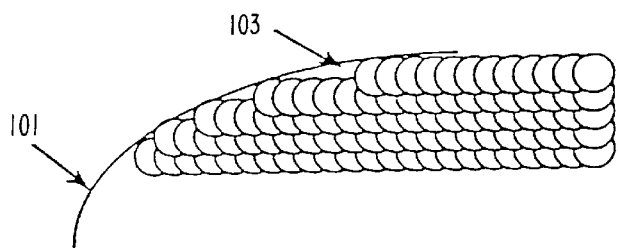
FIGS. 22(A), 22(B) and 22(C) show exemplary results when using proportional deflection techniques to create various edge contours of components.
Figure 22B:
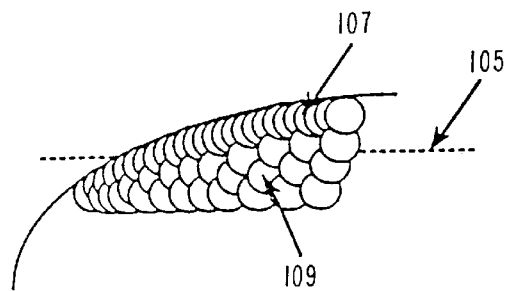
Figure 22C:
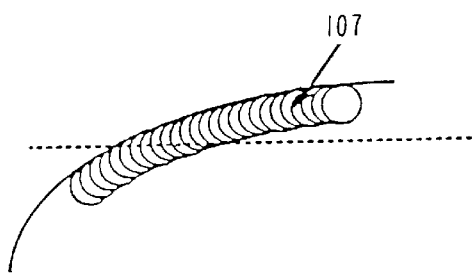

One effective application of the aspect of the invention is to use proportional deflection in order to create smooth edges on components. FIG. 22(A) shows the edge definition that would be obtained using an on-off printhead, (i.e., without proportional deflection) with a droplet spacing of 50 microns in both directions. It should be noted that in attempting to create the part contour 101, the attainable resolution of droplet placement causes significant steps, or discontinuous 103 to appear in the edges of the part. FIG. 22(B) shows a smooth edge that can be created using proportional deflection techniques. In this case a single scan line 105 is shown. It should be noted that the spacing of droplets along the scan line is smaller in the proportionally deflected case of FIG. 22 (B) than in the on-off case of FIG. 22 (A). Some of the droplets 107 are used to create the smooth edge contour itself, while some of the droplets 109 are used to fill in the area of the binder print line defined by one pass of the jet. For clarity, FIG. 22(C) shows only those droplets 107 which have been used to create the smooth edge contour.

Figure 23A:
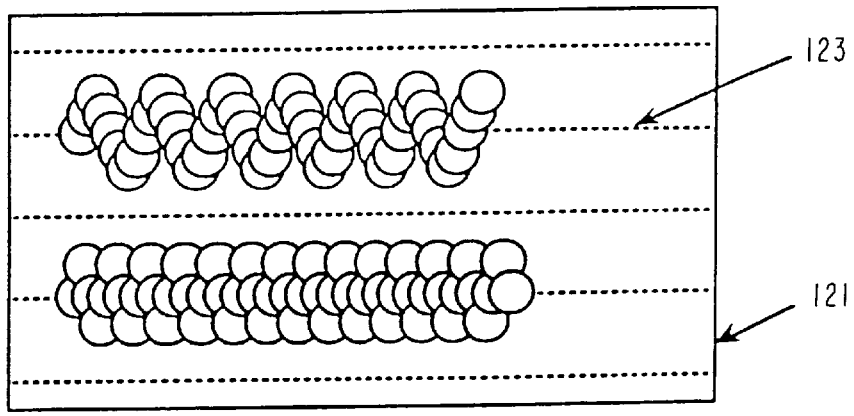
FIGS. 23(A), 23(B) and 23(C) show exemplary patterns created using proportional deflection techniques to define various interior structures of components.
Figure 23B:
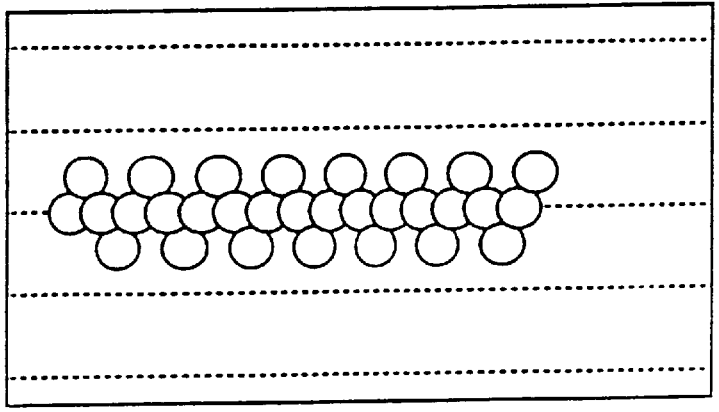
Figure 23C:
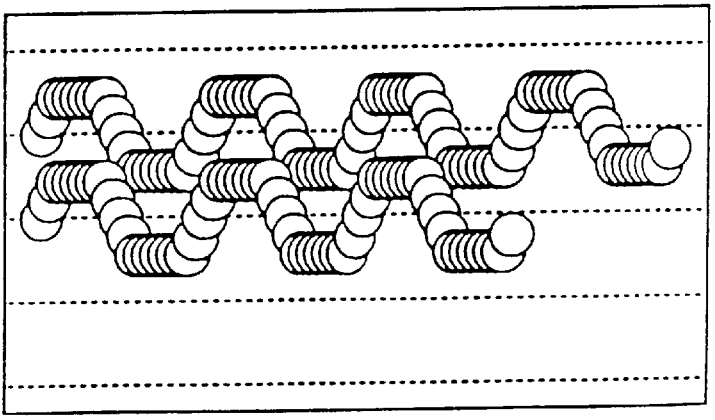

Another application of the invention is to use proportional deflection to create desired patterns and properties within the interior of the body of a component. FIG. 23(A) shows two different patterns that may be created within the body of a component by using proportional deflection to position the droplets. The patterns are each created around scan lines 123 within the printing area 121. It should be noted that no reduction in printing speed is needed to accomplish this droplet placement when using proportional deflection. Some patterns may be useful for creating deliberately isotropic properties within the component, while other patterns may be useful for creating deliberately anisotropic properties within the component. The degree of proportional deflection may even be selected by a random number generator to create unique part properties. FIG. 23(B) shows a pattern which utilizes relatively little overlap between adjacent droplets of a layer. Such patterns are useful when considering that the part is actually three dimensional and thus successive layers also display overlapped characteristics. Thus, it may be desired to minimize the overlap within a layer and to make use of greater overlap between layers to create certain desired properties of the part. One example is to deposit the droplets in a pattern that results in a placement of the droplets in the three dimensional part in a hexagonal closely-packed lattice array. Such a lattice array is familiar in the art of crystallography as an array which produces the highest packing of uniform sized spheres. The use of such a lattice array would be useful in creating parts with isotropic properties based on overlap in all three dimensions of the part. Further, it is possible to create parts that have no overlap between printed droplets within a plane, or layer, but which relies on the overlap between planes or layers to define a component. FIG. 23(C) shows a pattern that can be used to create a cellular structure within a component. In FIG. 23(C) the proper relationship between two adjacent lines of proportionally deflected droplets defines the cellular pattern within the component.

One problem that can arise when using continuous jet printheads is that certain changes in the binder stream over time can cause inaccuracies in the placement of droplets. These changes can be of two types. First of all, changes in the direction of the jet as it exits the nozzle can cause different landing positions of the droplets. Secondly, even if there is no change in the direction of the emerging jet, changes in the exit velocity of the stream can also cause changes in the landing position of droplets. This is because there is typically a 2 cm distance between the exit from the nozzle tip and the impact point on the porous bed. Also, typically the downward velocity of the jet is 10 m/sec and the lateral velocity is 2 m/sec. Thus, the droplet follows a trajectory where it impacts the powder bed at an angle and a change in the jet exit velocity will change the distance "downstream" that the droplet impacts. Accordingly, one aspect of the invention is to measure changes in both the stream angular position and the stream velocity, on-line in the machine, and to take corrective action based on these measurements so as to maintain overall drop placement accuracy.

Changes in jet position, i.e., the angular position of the jet stream, can be measured using optical techniques. For example, two CCD line cameras can be used to image the position of the stream, i.e., the jet position in two orthogonal directions, either when the printhead is at rest or when it is in motion, so that changes therein can be measured. In a three dimensional printing machine, such measurements might be taken while the machine is spreading the next layer of porous material. Changes in the stream velocity can be measured using any one of a variety of methods of flow rate measurement, e.g., including the measurement of pressure drop through a known restriction, and other techniques.

Figure 24:
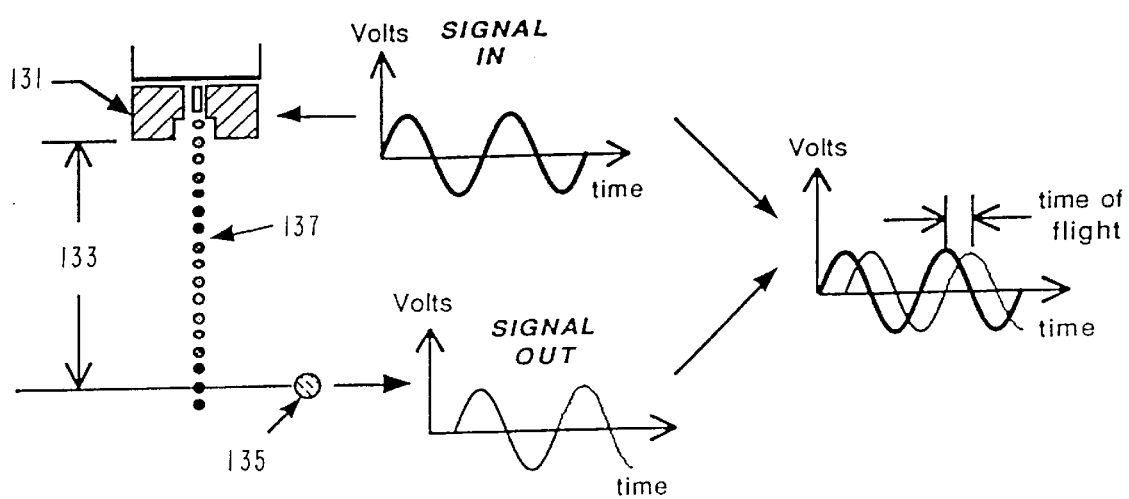
FIG. 24 shows an exemplary structure for making time of flight measurements with a continuous-jet printhead, together with exemplary voltage waveforms used therefor.

One particularly useful method in accordance with the invention is to directly measure changes in the time of flight of the droplets, that is the time between the moment of detachment from the stream and the moment of impact at the powder surface as illustrated in FIG. 24. The time of flight is the true parameter of interest (as opposed to the stream velocity) because the time of flight takes into account deceleration of the droplets as they travel to the powder. The time of flight may be measured by imposing a regular varying voltage, such as a sinusoidal voltage, at the charging cell 131 of a continuous-jet printhead, thereby imposing a sinusoidally varying charge on successive droplets 137. A wire or other conductive body 135, is appropriately carried by the printhead or is otherwise suitably positioned, at the level of the porous bed at a distance 133 from charging cell 131. The wire 135 acts as a capacitive pickup and yields a sinusoidally varying voltage which has a phase delay with respect to the sinusoidally varying voltage imposed at the charging cell 131. This phase delay may be used to provide a measurement of the time of flight. Typically, for a stream with an exit velocity of 10 m/sec and a droplet generation rate of 60 kilohertz and a flight distance 133 of 2 cm, the imposed sinusoidally varying voltage has a frequency between 200 and 1000 Hertz.

The measurement of time of flight, or any measurement of velocity, can be used to adjust the time of flight or velocity in a closed loop control system by modulation of the pressure driving the jet. For example, if the measured time of flight is higher than the desired time of flight, the pressure can be increased so to increase the jet velocity and decrease the time of flight. However, it will be understood that typically in a multiple nozzle printhead, no separate adjustment is possible for each of the velocities of the many jets and, hence, only the average velocity is used for such adjustments in a closed loop fashion.

The measurements of changes in jet position and either jet velocity or time of flight, as discussed above, must be used to correct for the accurate drop placement of each jet individually as no one correction will account for all the separate changes of the jets. The measurement of changes in jet position can be combined with a measurement in the change of time of flight by recognizing that an increase in the time of flight means that the droplet will travel further along the direction of fast scan of the raster before impacting on the powder bed. For example, if the time of flight is 2.0 msec and the fast axis scan speed is 1.0 m/s, the droplets will move 2 mm along the direction of fast scan of the raster as they fly from the point of detachment from the continuous-jet to the powder surface. If the time of flight should increase to 2.1 msec, there will be a shift in droplet landing position of 0.1 mm. This shift is functionally equivalent to a shift of 0.1 mm which would result from a change in the angular position of the jet. Thus, knowing the change in time of flight and the printhead traverse speed, the effect of the change in time of flight can be added to the measured change in jet position. These position changes may now be corrected for.

When the position of a jet changes so that the impact point moves along the direction of fast scan, the release point can be adjusted so that the impact takes place at the intended spot. This is accomplished by electronically advancing or retarding the information in the data file that defines the component model which information is supplied to the printhead as it travels along the direction of fast scan. For example, if the projected impact is further down the fast scan than desired, the information can be electronically advanced so that the actual impact is as desired. Referring to FIG. 20, when the position of a jet changes so that the impact point moves lateral to the direction of fast scan, the degree of proportional deflection may be changed by electronic control so as to cause the true impact at the desired location. Thus, by the combination of advancing/retarding information to the printhead and changing the amount of proportional deflection, the measured jet position and time of flight can be used to provide corrective actions to maintain drop placement accuracy.

While the particular embodiments of the invention represent preferred embodiments thereof, modifications may occur to those in the art within the spirit and scope of the invention. Hence, the invention is not to be construed as limited to the particular embodiments described herein, except as defined by the appended claims.

What is claimed is:

1. An apparatus for distributing a powder comprising:
   a support surface for receiving powder across at least a portion thereof;
   a powder dispenser mounted in association with said support surface to dispense the powder thereon;

a spreader moveable relative to said support surface for spreading the powder in a layer on said support surface; and a vibratory mechanism cooperative with said spreader to compact the powder in the layer, comprising a vibrating transducer system operative to vibrate said spreader.

2. An apparatus for distributing a powder comprising:

a support surface for receiving powder across at least a portion thereof:

a powder dispenser mounted in association with said support surface to dispense the powder thereon:

a spreader moveable relative to said support surface for spreading the powder in a layer on said support surface; and a vibratory mechanism cooperative with said spreader to compact the powder in the layer, wherein said vibratory mechanism is operative to vibrate said spreader as said spreader moves relative to said support surface.

3. An apparatus for distributing and compacting a powder comprising:

a support surface for receiving powder;

a powder dispenser mounted in association with said support surface to dispense the powder in a layer onto said support surface; and a vibratory mechanism to compact the dispensed powder in said layer;

wherein said powder dispenser includes a spreader mounted to move linearly across said support surface and said vibratory mechanism comprises a vibrating transducer system operative to vibrate said spreader at least during linear movement across said support surface.

4. The apparatus of claim 3, wherein said vibratory mechanism is operative to vibrate said spreader orthogonal to the layer of the dispensed powder.

5. For use in a system for making an object in successive layers, apparatus for distributing a powder across a support surface comprising:

a support surface for receiving powder;

a powder dispenser mounted in association with said support surface to dispense the powder in a layer onto said support surface, including a spreader mounted to move linearly across said support surface; and a vibratory mechanism cooperative with said support surface to compact the dispensed powder in the layer, comprising a vibrating transducer system operative to vibrate said spreader.

* * * * *